United States Patent
Mabuchi et al.

(10) Patent No.: US 8,542,504 B2
(45) Date of Patent: Sep. 24, 2013

(54) CONTROL CIRCUIT, POWER CONDITIONER INCLUDING THE CONTROL CIRCUIT, AND PHOTOVOLTAIC SYSTEM

(75) Inventors: Masao Mabuchi, Kyoto (JP); Mio Miyamoto, Kyoto (JP); Naoki Maki, Kyoto (JP); Kotaro Nakamura, Kyoto (JP); Akiyuki Tsunaga, Kyoto (JP)

(73) Assignee: Omron Corporation, Kyoto (JP)

( * ) Notice: Subject to any disclaimer, the term of this patent is extended or adjusted under 35 U.S.C. 154(b) by 298 days.

(21) Appl. No.: 13/028,681

(22) Filed: Feb. 16, 2011

(65) Prior Publication Data

US 2011/0222324 A1     Sep. 15, 2011

(30) Foreign Application Priority Data

Mar. 11, 2010   (JP) ................................. 2010-054246

(51) Int. Cl.
*H02M 1/12*         (2006.01)

(52) U.S. Cl.
USPC ............................... 363/40; 363/98; 363/132

(58) Field of Classification Search
USPC ................. 363/34, 35, 36, 37, 40, 41, 44, 45, 363/71, 95, 97, 98, 124, 127, 131, 132; 323/222, 271, 282, 283, 284
See application file for complete search history.

(56) References Cited

U.S. PATENT DOCUMENTS

| | | | |
|---|---|---|---|
| 7,660,134 B2 * | 2/2010 | Imai et al. | 363/17 |
| 2007/0090821 A1 | 4/2007 | Imai et al. | |
| 2008/0247204 A1 * | 10/2008 | Renken | 363/124 |
| 2010/0020576 A1 * | 1/2010 | Falk | 363/55 |
| 2010/0232191 A1 | 9/2010 | Mabuchi et al. | |

FOREIGN PATENT DOCUMENTS

| | | |
|---|---|---|
| JP | 11-118415 | 4/1999 |
| JP | 2002-10496 | 11/2002 |
| JP | 2002-354677 | 12/2002 |
| JP | 2004-187362 | 7/2004 |
| JP | 2010-220321 | 9/2010 |

* cited by examiner

*Primary Examiner* — Nguyen Tran

(74) *Attorney, Agent, or Firm* — Greenblum & Bernstein, P.L.C.

(57) ABSTRACT

A power conditioner of a photovoltaic system is configured operate at higher accuracy. A chopper circuit, a capacitor connected in parallel to the chopper circuit, and a control circuit that controls an ON/OFF status of switch elements in the chopper circuit to control charging and discharging of the capacitor are provided. The control circuit includes a measurement control section that measures an inter-end voltage of the capacitor and a control circuit section that performs a predetermined control operation from a measurement output of the measurement circuit section. The measurement circuit section includes a differential amplifier circuit that differentially amplifies the inter-end voltage of the capacitor. The circuit control section calibrates an in-phase component in the output of the differential amplifier circuit as an in-phase error and performs the control from the calibrated output from the differential amplifier circuit.

7 Claims, 12 Drawing Sheets

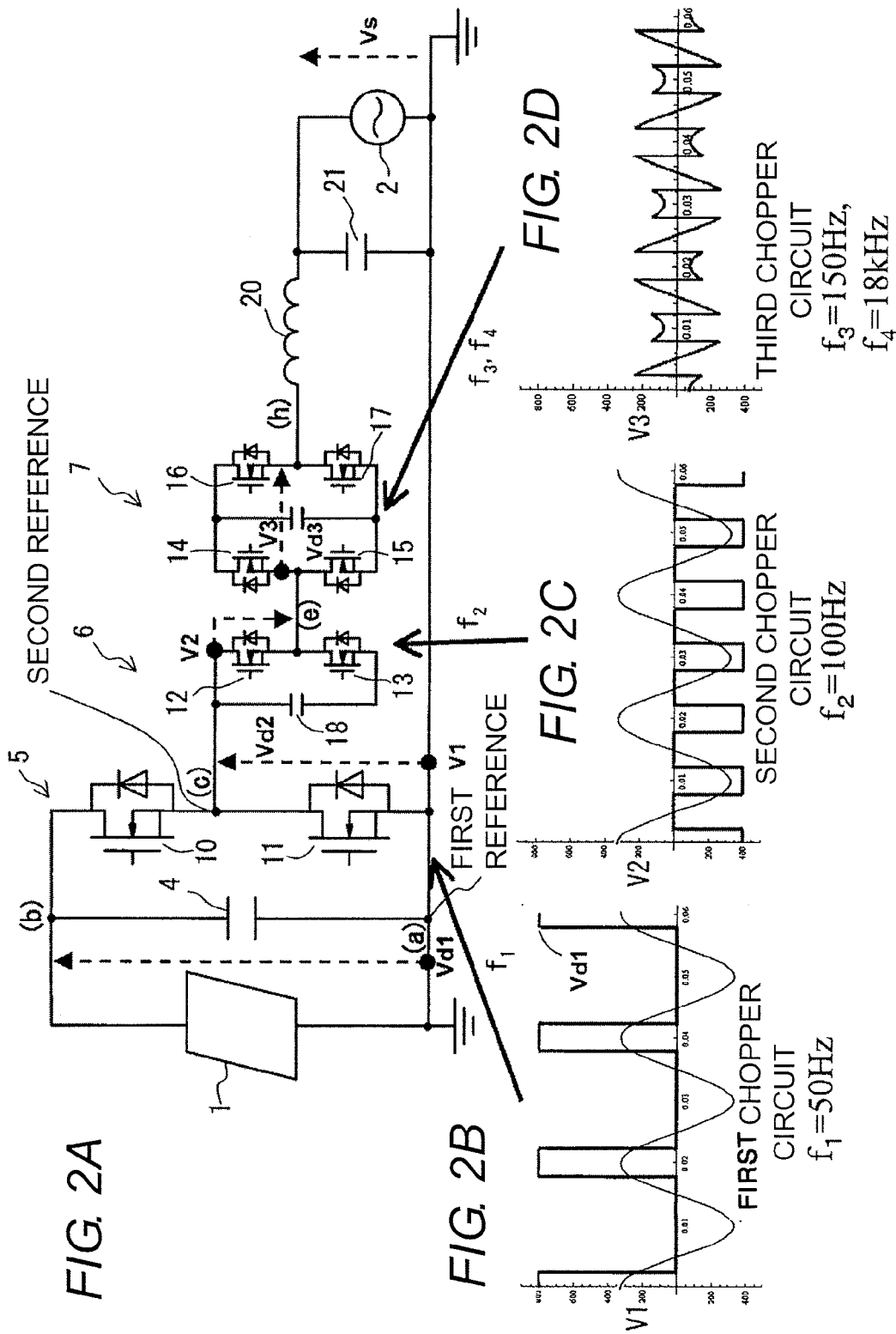

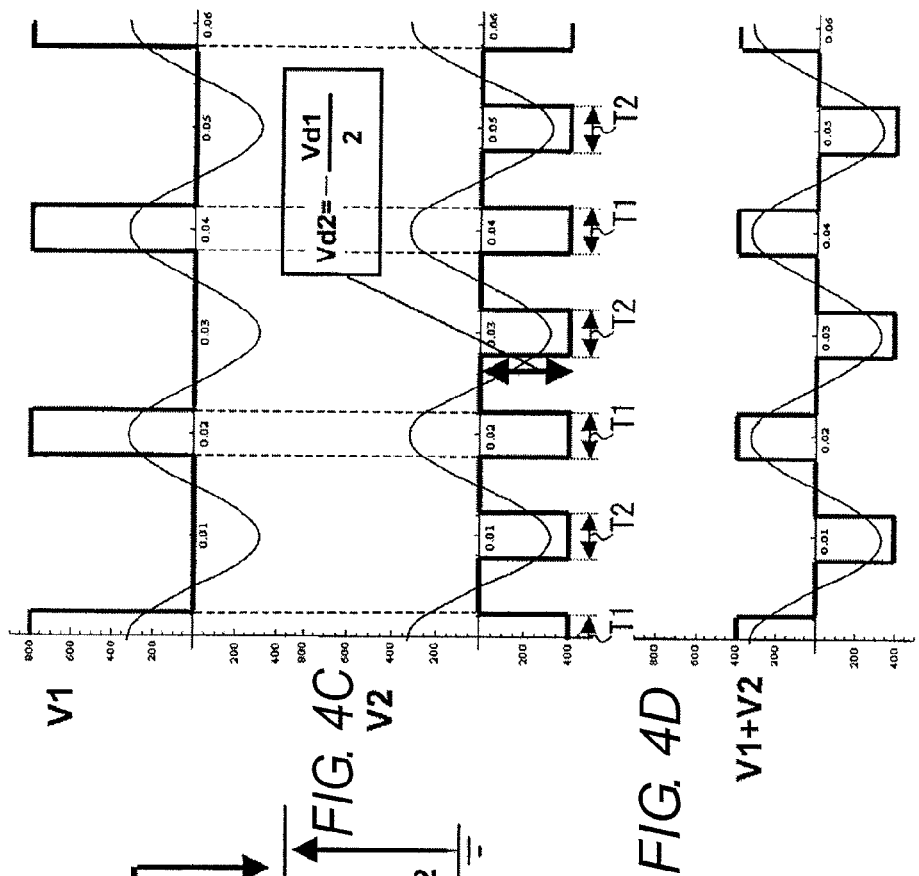
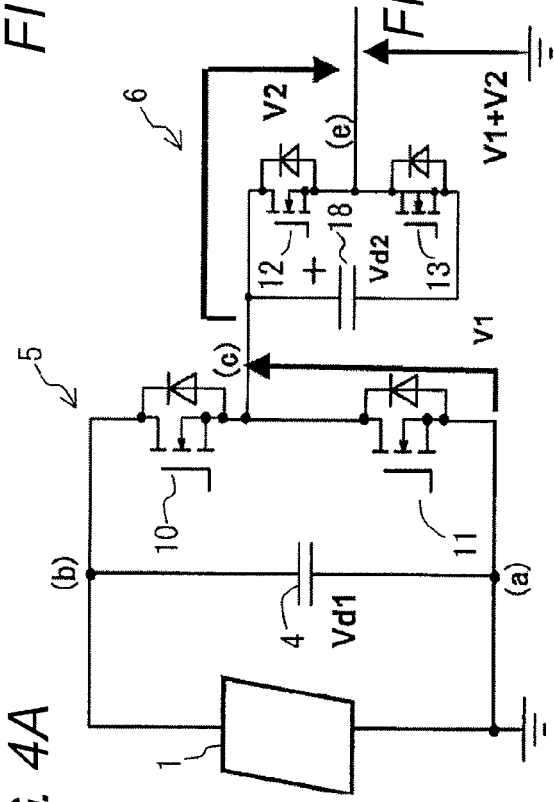
FIG. 4A
FIG. 4B
FIG. 4C
FIG. 4D

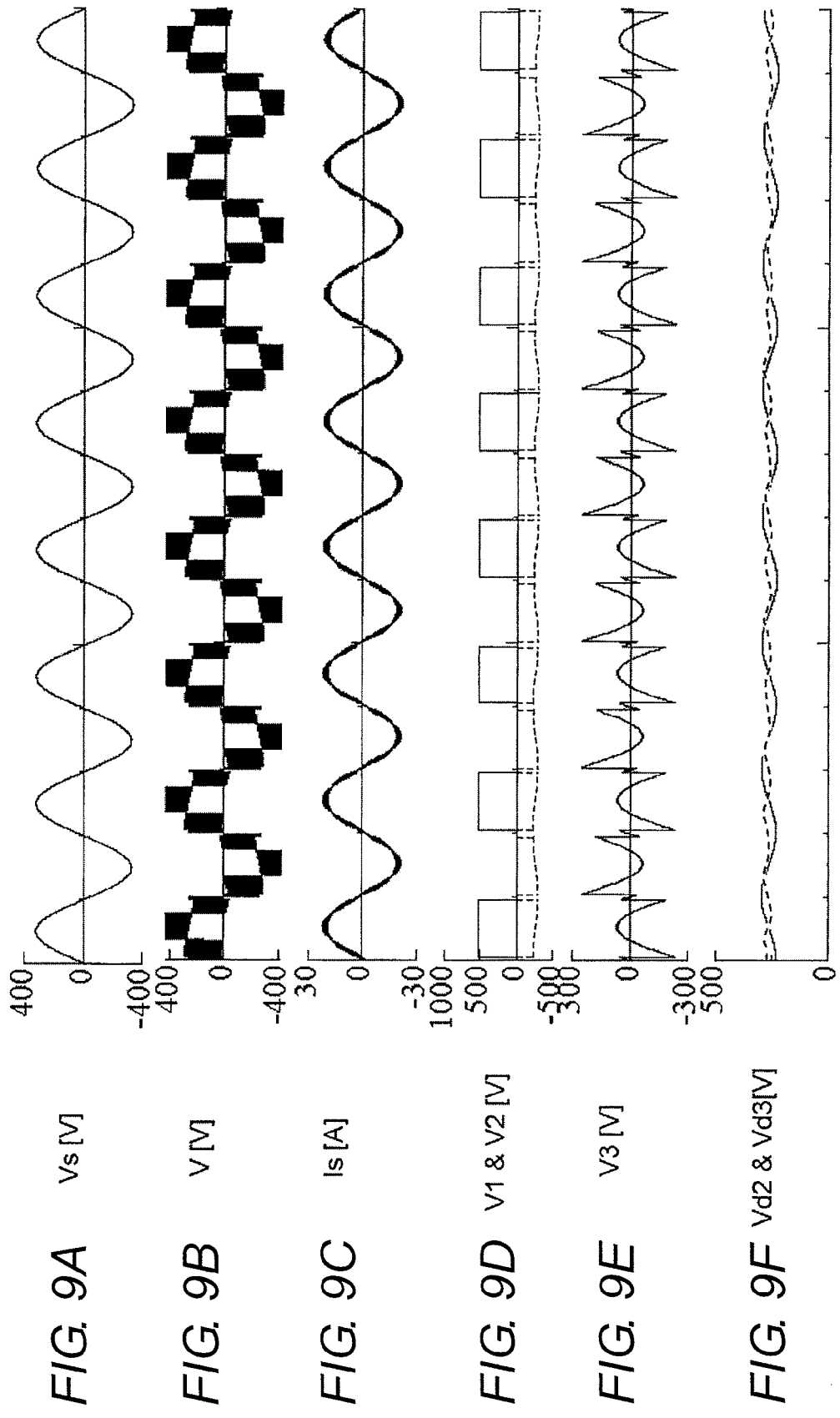

CONTROL CIRCUIT, POWER CONDITIONER INCLUDING THE CONTROL CIRCUIT, AND PHOTOVOLTAIC SYSTEM

CROSS-REFERENCE TO RELATED APPLICATION

This application claims benefit of priority under 35 U.S.C. §119 to Japanese Patent Application No. P2010-054246 filed on Mar. 11, 2010, which is expressly incorporated herein by reference in its entirety.

BACKGROUND

1. Field of the Disclosure

The present disclosure relates to a control circuit, a power conditioner including the control circuit, and a photovoltaic system.

2. Background Information

A photovoltaic system generally converts a direct-current (DC) power from a solar cell to an alternating-current (AC) power of a commercial frequency that is interconnected to a system by a power conditioner and also supplies the converted AC power to an in-house load connected to a commercial power system, where excessive power is reversely flowed to the system side if the AC power is greater than the consumption power of the in-house load. In such a power conditioner, a non-insulating type excelling in power conversion efficiency is greatly used (see e.g., Japanese Unexamined Patent Publication No. 2002-10496).

FIG. 14 shows a configuration example of a photovoltaic system including a non-insulating type power conditioner. A power conditioner 100 operates while being interconnected to a commercial power supply 2. The power conditioner 100 includes a smoothing capacitor 101 for smoothing a generated power output from a solar cell panel 1, an inverter 102 of PWM control, a filter 103 including a reactor, and a control circuit (not shown). In the power conditioner 100, the generated power output from the solar cell panel 1 is smoothened by the smoothing capacitor 101. The inverter 102 is configured by switch elements 104 to 107 including four MOSFETs connected in antiparallel by a diode. In the power conditioner 100, the switching control of turning ON/OFF the switch elements 104 to 107 in the inverter 102 at a high frequency of around 18 kHz is performed to convert the generated power output of the solar cell panel 1 smoothened by the smoothening capacitor 101 to the AC power synchronized with the commercial power system for output. The power conditioner 100 supplies the thus converted AC power to a load (not shown) through the filter 103, or reversely flows the same to the system side.

The mainstream of the solar cell configuring the solar cell panel 1 is a crystal system solar cell excelling in conversion efficiency. Meanwhile, an inexpensive thin film solar cell has been used in which the usage amount of silicon, which is a raw material, can be greatly reduced, a production process is simple, and an area can be increased. The thin film solar cell made of amorphous silicon is known to degrade over the years when the negative electrode side of the solar cell becomes lower than the ground potential.

The negative electrode side of the thin film solar cell needs to be the ground potential in order to prevent degradation in the thin film solar cell. However, since the level of reference potential differs for the DC side and for the AC side in the non-insulating type power conditioner 100, the negative electrode side of the solar cell, which is the input side of the power conditioner 100, cannot be the ground potential.

The present applicant thus already proposed a non-insulating type power conditioner capable of preventing degradation of the thin film solar cell and a photovoltaic system using the same (Japanese Patent Application No. 2009-61916 filed Mar. 13, 2009).

SUMMARY

The photovoltaic system according to a non-limiting aspect of the disclosure includes a power conditioner that converts a DC power from a solar cell panel to an AC power, and operating while being interconnected to a commercial power supply. Such a power conditioner includes a chopper circuit formed by connecting two switch elements in series, a capacitor connected in parallel to the chopper circuit, and a control circuit that controls the ON/OFF status of the switch elements in the chopper circuit to control charging and discharging of the capacitor. The control circuit includes a measurement circuit section that measures the inter-end voltage of the capacitor, and a control circuit section that performs a predetermined control operation from the measurement output of the measurement circuit section, in which the measurement circuit section includes a differential amplifier circuit for differentially amplifying (that differentially amplifies) the inter-end voltage of the capacitor, and the control circuit section performs the ON/OFF control of the switch elements by the measurement output from the differential amplifier circuit.

The differential amplifier circuit inputs one capacitor electrode point potential and another capacitor electrode point potential of the capacitor and differentially amplifies the inputs, in which the output value of the differential amplifier circuit is output to the control circuit section.

However, if an in-phase component (see detailed description in the embodiments) is contained in both input components to the differential amplifier circuit, the in-phase component appears in the output of the differential amplifier circuit as an error component, in which the error component also appears in a digital measurement signal as an A/D conversion value of the differential amplifier circuit output in the control circuit section, thus adversely affecting the highly accurate operation of the power conditioner since the ON/OFF control of the switch element is carried out by the error component.

A non-limiting feature of the disclosure is to solve the problems described above, and a feature thereof is to provide a power conditioner enabling highly accurate operation by calibrating the in-phase component in the output of the differential amplifier circuit as an in-phase error, and a photovoltaic system equipped with the same.

In accordance with one feature of the present disclosure, a control circuit is provided including a measurement controller that measures an inter-end voltage of a capacitor, and a circuit controller that performs a control operation from a measurement output of the measurement circuit section. The measurement controller includes a differential amplifier circuit for differentially amplifying (that differentially amplifies) the inter-end voltage of the capacitor, and the circuit controller calibrates an in-phase component in the output of the differential amplifier circuit as an in-phase error and performs the control operation from a calibrated measurement output from the differential amplifier circuit. The circuit controller may perform the calibration by cancelling the in-phase error by an in-phase error correction amount.

In accordance with another feature of the present disclosure, a power conditioner is provided including a chopper circuit formed by connecting at least two switch elements in a series, a capacitor connected in parallel to the chopper circuit, and a control circuit that controls an ON/OFF status of the switch elements in the chopper circuit to control charging and discharging of the capacitor, the control circuit being the power conditioner including the measurement controller that measures an inter-end voltage of a capacitor and a circuit controller that performs a control operation from a measurement output of the measurement circuit section. The control circuit is configured by the control circuit described above.

According to one feature, one of at least two inputs to the differential amplifier circuit is a voltage from a ground of one of the capacitor electrodes when a DC voltage is charged from the one capacitor electrode to the capacitor through one of the switch elements of the chopper circuit during an ON period of the switch element, and the other is a voltage from the ground of the other capacitor electrode.

According to another feature, first, second, and third units are arranged, the first unit including a first switch circuit formed by connecting two first and second switch elements in a series, the first switch circuit being connected in parallel to a first capacitor connected between positive and negative electrodes of a DC power source. The first and second switch elements are alternately turned ON/OFF at a first frequency; the second unit including a parallel connection circuit of a second capacitor and a second switch circuit, one side of the parallel connection of the parallel connection circuit being connected to a serial connecting node of the first and second switch elements, the second switch circuit being formed by connecting two third and fourth switch elements in a series, and the third and fourth switch elements being alternately turned ON/OFF at a second frequency. The third unit includes a parallel connection circuit of a third switch circuit and a third capacitor, and a fourth switch circuit connected in parallel to the parallel connection circuit, the third switch circuit being formed by connecting two fifth and sixth switch elements in a series, the serial connecting node of the fifth and sixth switch elements being connected to the serial connecting node of the third and fourth switch elements, the fifth and sixth switch elements being alternately turned ON/OFF at a third frequency. The fourth switch circuit is formed by connecting two seventh and eighth switch elements in a series, and the seventh and eighth switch elements being PWM controlled at a PWM frequency higher than the third frequency, in which a control circuit that controls the ON/OFF status of the first to eight switch elements is further arranged The control circuit includes a measurement controller that measures an inter-end voltage of each capacitor and a circuit controller that performs a predetermined control operation from a measurement output of the measurement circuit section; the measurement controller including a differential amplifier circuit for differentially amplifying (that differentially amplifies) the inter-end voltage of each capacitor and the circuit controller calibrating an in-phase component in the output of the differential amplifier circuit as an in-phase error and performing the control from the calibrated measurement output from each differential amplifier circuit.

In accordance with still another feature of the present disclosure, a photovoltaic system is provided including a thin film solar cell, and a power conditioner arranged between the thin film solar cell and a commercial power supply, that converts a DC power from the thin film solar cell to an AC power that is interconnected to a system of the commercial power supply and outputs the AC power. The power conditioner includes the power conditioner described above.

According to the present disclosure, since the in-phase error is calibrated from the output of the differential amplifier circuit for differentially amplifying (that differentially amplifies) the inter-end voltage of the capacitor, the switch element can be ON/OFF controlled at higher accuracy in the control circuit that controls the ON/OFF of the switch element by the output of the differential amplifier circuit, and consequently, a more accurate operation can be carried out in the power conditioner equipped with such a control circuit.

BRIEF DESCRIPTION OF THE DRAWINGS

FIG. 2A is a partial schematic diagram of the photovoltaic system of FIG. 2;

FIG. 2B is a voltage diagram associated with a first chopper circuit of FIG. 2;

FIG. 2C is a voltage diagram associated with a second chopper circuit of FIG. 2;

FIG. 2D is a voltage diagram associated with a third chopper circuit of FIG. 2;

FIG. 4A is a schematic diagram of the first chopper circuit and the second chopper circuit;

FIG. 4B is a voltage diagram showing the voltage V1 of the second chopper circuit;

FIG. 4C is a voltage diagram showing the voltage V2 of the second chopper circuit;

FIG. 4D is a voltage diagram showing the voltage V1+V2 of the second chopper circuit;

FIG. 9A is a view showing a waveform of the system voltage Vs of FIG. 1;

FIG. 9B is a view showing a waveform of the output voltage V of the third chopper circuit of FIG. 1;

FIG. 9C is a view showing a waveform of the system current Is of FIG. 1;

FIG. 9D is a view showing a waveform of the voltages V1 and V2 of FIG. 1;

FIG. 9E is a view showing a waveform of the voltage V3 of FIG. 1;

FIG. 9F is a view showing a waveform of the voltages Vd2 and Vd3 of FIG. 1;

DETAILED DESCRIPTION

Hereinafter, preferred embodiments of the present disclosure will be described with reference to the drawings.

Figure 1:
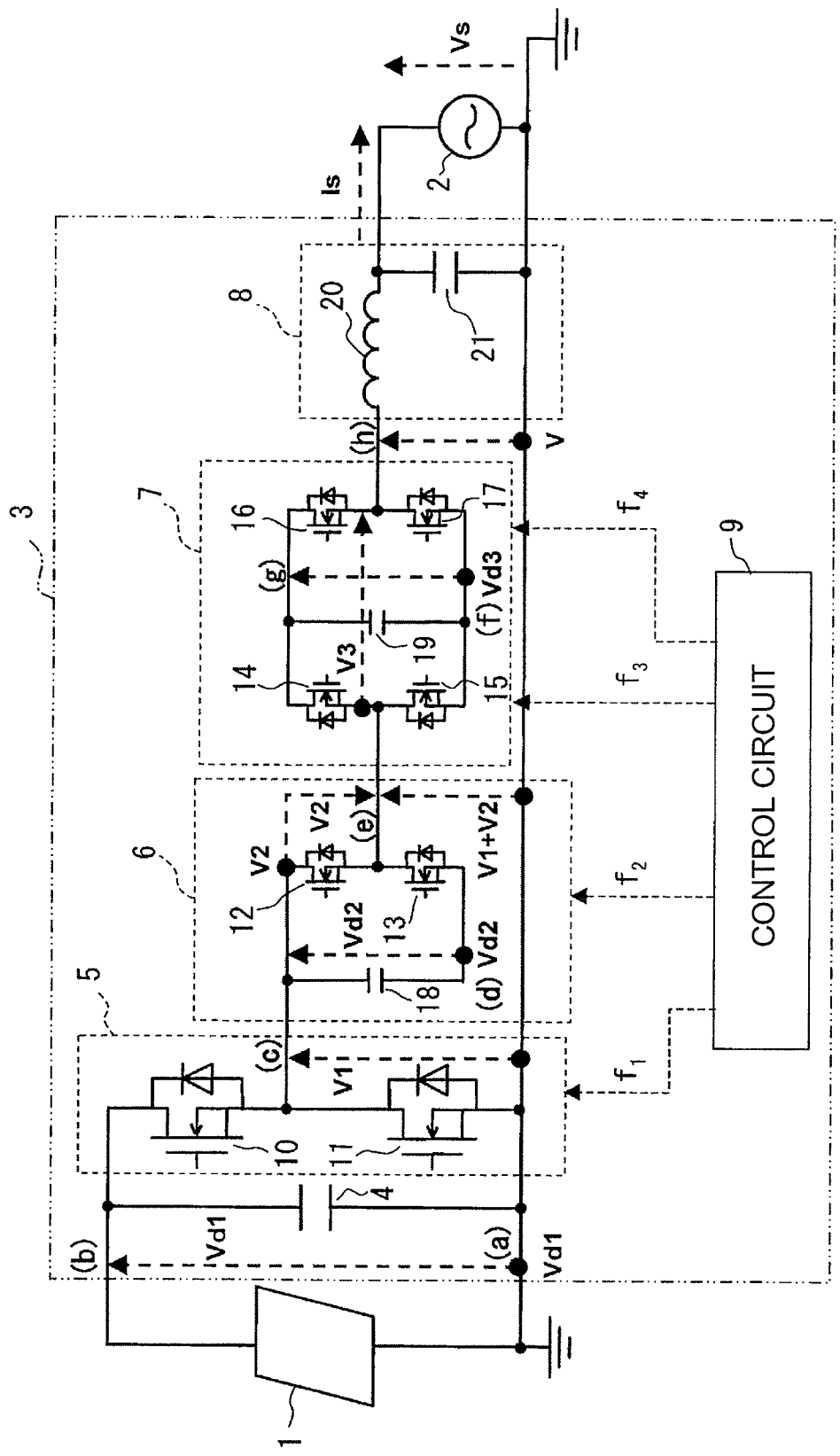
FIG. 1 is a schematic diagram of a photovoltaic system according to an embodiment of the present disclosure.

FIG. 1 is a configuration diagram of a photovoltaic system according to one embodiment of the present disclosure, showing a configuration for a case of single-phase two-wire.

The photovoltaic system of the embodiment includes a solar cell panel 1, and a power conditioner 3 for converting the DC power from the solar cell panel 1 to the AC power and operating while being interconnected to a commercial power supply 2.

The solar cell panel 1 is configured by connecting a plurality of solar cell modules in series and in parallel to obtain a desired generated power.

The solar cell panel 1 of the embodiment is configured by a thin film solar cell made of amorphous silicon.

The power conditioner 3 of the present embodiment is a non-insulating type (transformer-less) power conditioner not including an insulating transformer.

The power conditioner 3 includes a first capacitor 4 as a smoothing capacitor, first to third chopper circuits 5 to 7, a noise filter 8, and a control circuit 9 for measuring the voltage etc. of each unit to control each chopper circuit 5 to 7.

The first to third chopper circuits 5 to 7 and the control circuit 9 configure a chopper converter cascade connected with respect to the solar cell panel 1.

The negative electrode side of the solar cell panel 1 is grounded. A point (a) in the figure is the ground, and the voltage of the ground is zero. A point (b) is the positive electrode side of the solar cell panel 1.

The first capacitor 4 is connected in parallel between the positive and negative electrodes of the solar cell panel 1.

The first chopper circuit 5 is connected in parallel to the first capacitor 4.

The first chopper circuit 5 includes two first and second switch elements 10, 11 connected in series. A diode is connected in anti-parallel to the first and second switch elements 10, 11. The first chopper circuit 5 configures a first switch circuit with the two first and second switch elements 10, 11.

In the first chopper circuit 5, the first and second switch elements 10, 11 are alternately ON/OFF controlled at a first frequency $f_1$ same as a system frequency such as 50 Hz by a gate signal from the control circuit 9. The first and second switch elements 10, 11 are configured by an N-channel MOSFET similar to switch elements 12 to 17 of the second and third chopper circuits 6, 7. The switch element is not limited to the MOSFET, and may be other switch elements such as IGBT and a transistor.

The second chopper circuit 6 includes a second capacitor 18, and a second switch circuit formed by connecting in series two third and fourth switch elements 12, 13, to which a diode is connected in anti-parallel. The second capacitor 18 and the second switch circuit are connected in parallel to each other. The third and fourth switch elements 12, 13 are alternately ON/OFF controlled at a second frequency $f_2$ such as 100 Hz, which is a frequency two times the first frequency $f_1$, by the gate signal from the control circuit 9.

One end side in the parallel connection of the second capacitor 18 and the second switch circuit in the second chopper circuit 6 is connected to a serial connecting node of the first and second switch elements 10, 11 in the first chopper circuit 5. Such a connecting point is shown as (c) in the figure. In the figure, (c) and (d) correspond to both capacitor electrode sides of the second capacitor 18.

The third chopper circuit 7 includes a third switch circuit formed by connecting in series two fifth and sixth switch elements 14, 15, to which a diode is connected in anti-parallel, a third capacitor 19, and a fourth switch circuit formed by connecting in series two seventh and eighth switch elements 16, 17, to which a diode is connected in anti-parallel. In the third chopper circuit 7, the third switch circuit, the third capacitor 19, and the fourth switch circuit are parallel connected to each other. One end side and the other end side of the parallel connection of such circuits are shown as (f) and (g) in the figure. Both capacitor electrode sides of the third capacitor 19 correspond to (f) and (g).

The fifth and sixth switch elements 14, 15 are alternately ON/OFF controlled at a third frequency $f_3$ such as 150 Hz, which is a frequency three times the first frequency $f_1$, by the gate signal from the control circuit 9.

The seventh and eighth switch elements 16, 17 are PWM controlled at a high frequency $f_4$ such as 18 kHz by the gate signal from the control circuit 9.

The serial connecting node of the fifth and sixth switch elements 14, 15 of the third chopper circuit 7 is connected to the serial connecting node of the third and fourth switch elements 12, 13 of the second chopper circuit 6. The connecting point is shown as (e) in the figure.

The noise filter 8 including a reactor 20 and a fourth capacitor 21 is connected to the serial connecting node of the seventh and eighth switch elements 16, 17 of the third chopper circuit 7. The connecting point is shown as (h) in the figure.

A load (not shown) and the commercial power supply 2 are connected to the noise filter 8.

Figure 10:
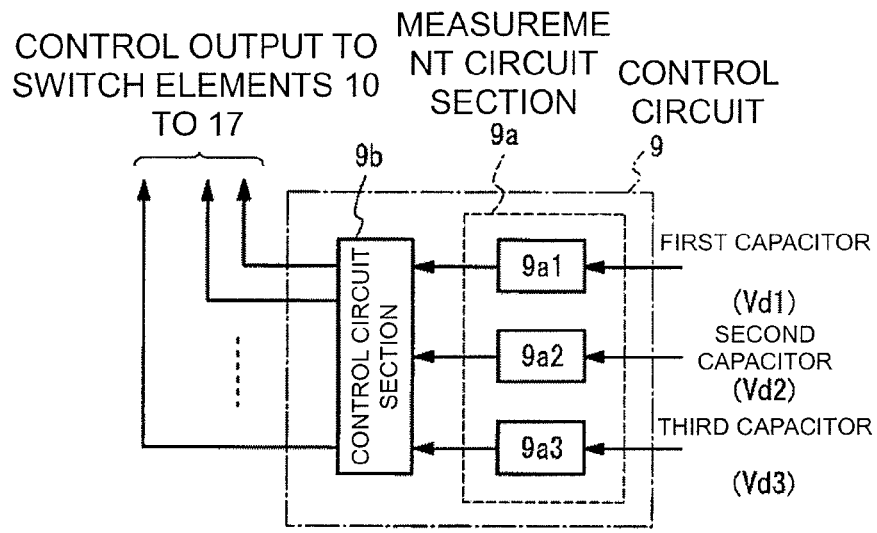
FIG. 10 is a view showing a schematic configuration of a control circuit according to an embodiment of the disclosure.

The control circuit 9 measures a system voltage Vs and a system current Is through a differential amplifier circuit and the like (not shown), calculates a command value V* of a sine-wave target voltage synchronized with the system frequency of the commercial power supply 2 similar to the prior art, and also measures voltages Vd1, Vd2, Vd3 at both ends of the first to third capacitors 4, 18, 19 through a differential amplifier circuit and the like shown in FIG. 10 to generate the gate signal for controlling each chopper circuit 5 to 7.

The voltage Vd1 is the DC output voltage of the solar cell panel 1 that appears at the point (b) with the voltage at the point (a) that is the ground as the reference.

The voltage Vd2 is the charging voltage at one capacitor electrode point (c) with the other capacitor electrode point (d) of the second capacitor 18 of the second chopper circuit 6 as the reference.

The voltage Vd3 is the charging voltage at one capacitor electrode point (g) with the other capacitor electrode point (0 of the third capacitor 19 of the third chopper circuit 7 as the reference.

FIGS. 2A to 2D are views for describing the outline of the operation of each chopper circuit 5 to 7 in the embodiment, where FIG. 2A is a configuration diagram of a main part of FIG. 1, and FIGS. 2B to 2D show the voltages V1, V2, V3 in FIG. 2A, where the waveform of the command value V* of the sine-wave target voltage synchronized with the system is shown with a thin solid line in FIGS. 2B and 2C.

The voltage V1 is the voltage at a point (c) that is the serial connecting node of the first and second switch elements 10, 11 of the first chopper circuit 5 having the potential at the point (a) that is the ground as the first reference potential.

The voltage V2 is the voltage at a point (e) that is the serial connecting node of the third and fourth switch elements 12, 13 of the second chopper circuit 6 having the potential at the point (c) as the second reference potential.

The voltage V3 is the voltage at a point (h) that is the serial connecting node of the seventh and eighth switch elements 16, 17 having the point (e) that is the serial connecting node of the fifth and sixth switch elements 14, 15 of the third chopper circuit 7 as the reference.

In the first chopper circuit 5, the first and second switch elements 10, 11 are alternately ON/OFF controlled at the first frequency $f_1$ of 50 Hz same as the system frequency in the case of being 50 Hz same as the system frequency of the commercial power supply 2.

Thus, the voltage V1 at the point (c) that is the serial connecting node of the first and second switch elements 10, 11 becomes a first square wave voltage column including a plurality of square wave voltages rising on the positive side, as shown in FIG. 2B. The voltage level of the square wave of the voltage V1 is the DC output voltage Vd1 of the solar cell panel 1.

In the second chopper circuit 6, the third and fourth switch elements 12, 13 are alternately ON/OFF controlled at the second frequency $f_2$ of 100 Hz, which is the frequency two times the first frequency $f_1$.

Thus, the voltage V2 at the point (e) that is the serial connecting node of the third and fourth switch elements 12, 13 becomes a second square wave voltage column including a plurality of square wave voltages rising on the negative side with the point (c) that is the serial connecting node of the first and second switch elements 10, 11 as the reference, as shown in FIG. 2C.

The voltage level of the square wave of the voltage V2 is controlled to be ½ of the DC output voltage Vd1.

The voltage V2 at the point (e) that is the serial connecting node of the third and fourth switch elements 12, 13 of the second chopper circuit 6 is the voltage V1+V2 having a stepwise waveform corresponding to the sine wave form that alternately changes to positive and negative in which the voltage V1 between the points (a) and (c) and the voltage V2 between the points (c) and (e) are added, as will be shown in FIG. 4D hereinafter, if the point (a) that is the ground is the reference, that is, if the first reference potential is the reference. The stepwise voltage V1+V2 alternately changes to positive and negative in synchronization with the command value V* of the sine-wave target value described above indicated with a thin solid line in FIG. 4D.

In the third chopper circuit 7, the fifth and sixth switch elements 14, 15 are alternately ON/OFF controlled at a third frequency $f_3$ of 150 Hz, which is the frequency three times the first frequency $f_1$, so as to compensate for the difference voltage of the voltage V1+V2 having the stepwise waveform and the command value V* of the sine-wave target voltage, and the seventh and eighth switch elements 16, 17 are PWM controlled at the frequency $f_4$ of 18 kHz.

Thus, the voltage V3 at the point (h) that is the serial connecting node of the seventh and eighth switch elements 16, 17 of the third chopper circuit 7 of FIG. 2A corresponds to the difference voltage of the voltage V1+V2 having the stepwise waveform and the command value V* of the sine-wave target voltage, as shown in FIG. 2D when shown with the average value of PWM with the point (e) that is the serial connecting node of the fifth and sixth switch elements 14, 15 as a reference.

Therefore, the voltage V3 of the point (h) that is the serial connecting node of the seventh and eighth switch elements 16, 17 of the third chopper circuit 6 is the sine-wave voltage corresponding to the command value V* of the target value synchronized with the commercial power supply 2 when the first reference potential at the point (a) that is the ground is the reference.

The operating principle of the first to third chopper circuits 5 to 7 will be further described in detail.

Figures 3A, 3B:
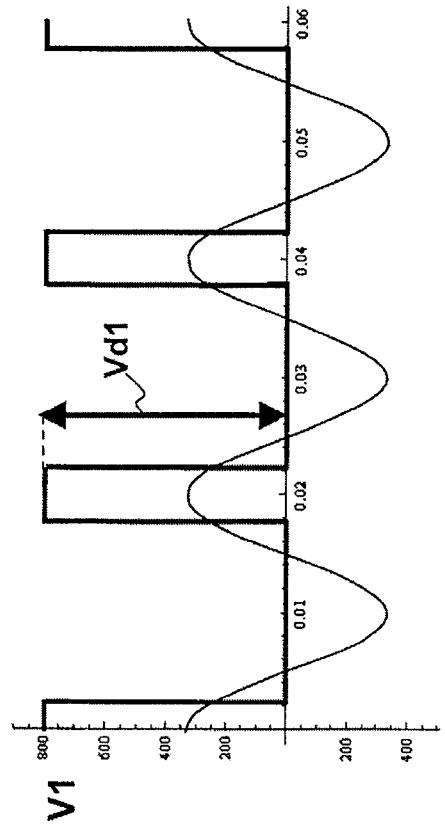
FIG. 3A is a partial schematic diagram of the first chopper circuit.
FIG. 3B is a voltage diagram showing the voltage V1 of the first chopper circuit of FIG. 2B.

FIGS. 3A and 3B are views for describing the operating principle of the first chopper circuit 5, where FIG. 3A shows the solar cell panel 1, the first capacitor 4, and the first chopper circuit 5, and FIG. 3B shows the voltage V1 between (a) to (c). In particular, FIG. 3B shows the command value V* of the sine-wave target voltage with a thin solid line.

The DC output voltage Vd1 of the solar cell panel 11 smoothed by the first capacitor 4 with the potential at the point (a) that is the ground as the first reference potential appears at the point (b) that is the positive electrode side of the solar cell panel 1.

In the first chopper circuit 5, the DC output voltage Vd1 is chopped by the first and second switch elements 10, 11 ON/OFF controlled alternately at the first frequency $f_1$ of 50 Hz.

When the first switch element 10 is ON and the second switch element 11 is OFF, the charging voltage Vd1 of the first capacitor 4 which is the voltage at the point (b) appears at the point (c) that is the serial connecting node of the first and second switch elements 10, 11 of the first chopper circuit 5.

When the first switch element 10 is OFF and the second switch element 11 is ON, the ground voltage at the point (a) appears at the point (c) that is the serial connecting node of the first and second switch elements 10, 11 of the first chopper circuit 5.

Therefore, as described above, the voltage V1 at the point (c) that is the serial connecting node of the first and second switch elements 10, 11 is a first square wave voltage column including a plurality of square wave voltages rising on the positive side with the ground potential as the first reference potential, as shown in FIG. 3B. The voltage V1 is the voltage at the point (c) that is the serial connecting node of the first and second switch elements 10, 11 having the point (a) as the reference, where the voltage level of the square wave is the DC output voltage Vd1 of the solar cell panel 1 such as 80V.

The effective power can be output in the first chopper circuit 5 since the square wave voltage column that matches the voltage and the phase of the system is generated.

FIGS. 4A to 4D are views for describing the operating principle of the second chopper circuit 6, where FIG. 4A shows the first chopper circuit 5 and the second chopper circuit 6, FIG. 4B shows the voltage V1, FIG. 4C shows the voltage V2, and FIG. 4D shows the voltage V1+V2, FIGS. 4B to 4D also showing the command value V* of the sine-wave target voltage with a thin solid line.

In the second chopper circuit 6, the voltage V1 at the point (c) shown in FIG. 4B is chopped by the third and fourth switch elements 12, 13 ON/OFF controlled alternately at the second frequency $f_2$ of 100 Hz.

When the third switch element 12 is ON and the fourth switch element 13 is OFF, the point (e) that is the serial connecting node of the third and fourth switch elements 12, 13 is the same potential as the point (c) that is the serial connecting node of the first and second switch elements 10, 11 of the first chopper circuit 5, whereas when the third switch element 12 is OFF and the fourth switch element 13 is ON, the potential at the point (e) that is the serial connecting node of the third and forth switch elements 12, 13 is negative than the potential at the point (c). Therefore, the voltage V2 at the point (e) that is the serial connecting node of the third and fourth switch elements 12, 13 is a second square wave voltage column including a plurality of square wave voltages rising on the negative side as shown in FIG. 4C with the potential at the point (c) that is the serial connecting node of the first and second switch elements 10, 11 as the second reference potential, as described above.

When the first switch element 10 of the first chopper circuit 5 is ON and the second switch element 11 is OFF, the second capacitor 18 is charged by turning OFF the third switch element 12 of the second chopper circuit 6 and turning ON the fourth switch element 13. Furthermore, when the first switch element 10 of the first chopper circuit 5 is OFF and the second switch element 11 is ON, the charging load of the second capacitor 18 is discharged through the switch elements 11, 13 that are turned ON by turning OFF the third switch element 12 of the second chopper circuit 6 and turning ON the fourth switch element 13. Therefore, as shown in FIG. 4C, the second capacitor 18 alternately repeats charging over a charging period T1 and discharging over a discharging period T2, so that the square wave voltage falling on the negative side is generated with the second reference potential at the point (c) as the reference. The voltage level Vd2 of the square wave is ½ of the DC output voltage Vd1 of the solar cell panel 1 (Vd2=−Vd½) such as 400V.

The voltage V2 is the voltage at the point (e) that is the serial connecting node of the third and fourth switch elements 12, 13 having the point (c) that is the serial connecting node of the first and second switch elements 10, 11 as the reference. Therefore, in the second chopper circuit 6, the voltage V1+V2 having the stepwise waveform that alternately changes to positive and negative in correspondence with the change in the command value V* of the sine-wave target voltage shown in FIG. 4D, which is the sum of the voltage V1 between the points (a) and (c) of FIG. 4B and the voltage V2 between the points (c) and (e) of FIG. 4C, appears at the point (e) with the potential at the point (a) that is the ground as the first reference potential.

In the second chopper circuit 6, the harmonic of even order can be removed since the square wave voltage column that falls to the negative side is generated, and the principle effective power is zero since charging and discharging are repeated at equal power.

The charging and discharging are carried out when the system current Is of FIG. 9C, to be described later, flows to the second capacitor 18. When the system current Is of FIG. 9C is positive, the second capacitor 18 is charged with the sine-wave current during the period of T1 of FIG. 4C. Thus, V2 gradually decreases during the T1 period in the actual operation. Similarly, when the system current Is of FIG. 9C is negative, the second capacitor 18 is discharged with the sine-wave current during the period of T2 of FIG. 4C. Thus, V2 gradually increases during the T2 period in the actual operation.

Figure 5:
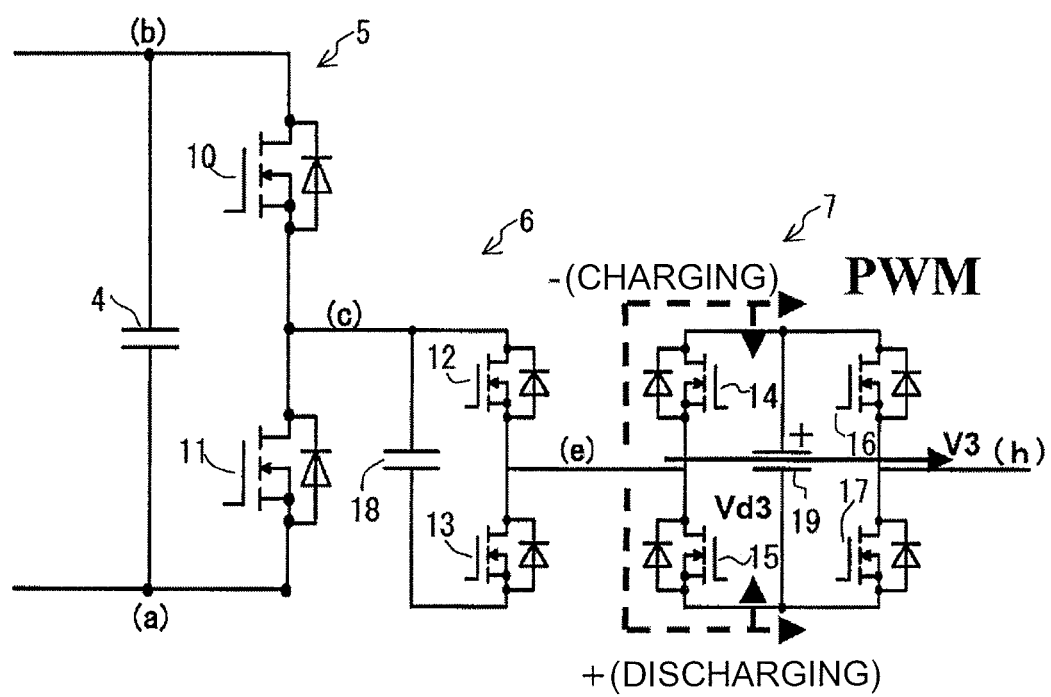
FIG. 5 is a schematic diagram of the third chopper circuit.
Figure 6A:
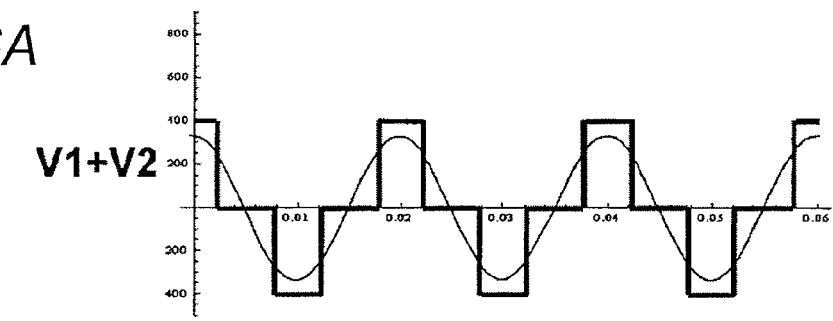
FIG. 6A is a view showing a waveform for voltage V1+V2 of the third chopper circuit.
Figure 6B:
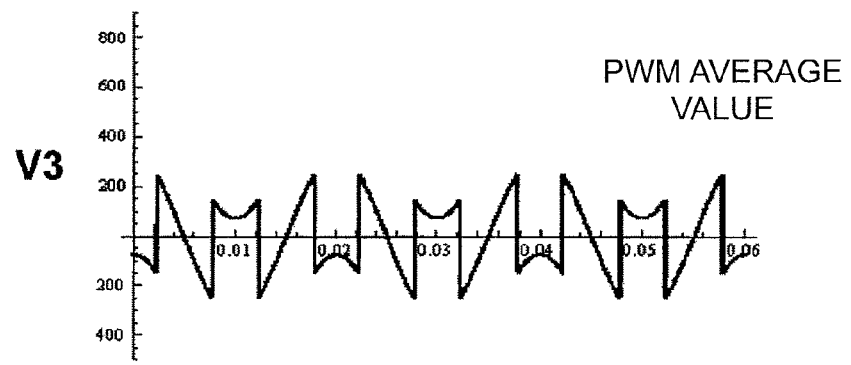
FIG. 6B is a view showing a waveform for voltage V3 of the third chopper circuit.

FIG. 5 is a view for describing the operating principle of the third chopper circuit 7, and FIG. 6A shows the voltage V1+V2 having the stepwise waveform and FIG. 6B shows the voltage V3 at the point (h) that is the serial connecting node of the seventh and eighth switch elements 16, 17 as the average value of PWM with the point (e) that is the serial connecting node of the fifth and sixth switch elements 14, 15 as the reference, FIG. 6A also showing the command value V* of the sine-wave target value with a thin solid line.

The fifth and sixth switch elements 14, 15 are ON/OFF controlled at the timing corresponding to the positive and negative of the difference voltage between the voltage V1+V2 having the stepwise waveform at the point (e) shown in FIG. 6A and the command value V* of the sine-wave target voltage. As a result, the voltage V1+V2 is charged and discharged with respect to the third capacitor 19 at the timing of its ON/OFF control.

In other words, the difference voltage is positive if a relational expression voltage V1+V2>command value V* of sine-wave target voltage is satisfied, and the voltage V1+V2 is charged to the third capacitor 19 as a result of controlling the fifth switch element 14 to ON and the sixth switch element 15 to OFF.

The difference voltage is negative if a relational expression voltage V1+V2<command value V* of sine-wave target voltage is satisfied, and the voltage charged in the third capacitor 19 is discharged as a result of controlling the fifth switch element 14 to OFF and the sixth switch element 15 to ON.

The period of the magnitude relationship of the difference voltage is 150 Hz which is the third frequency $f_3$, and the fifth and sixth switch elements 14, 15 are alternately ON/OFF controlled at the third frequency $f_3$ as a result.

In the third chopper circuit 7, the seventh and eighth switch elements 16, 17 are PWM controlled at the fourth frequency $f_4$ of 18 kHz, which is a frequency higher by a few hundred times than the first frequency $f_1$, at a duty for correcting the difference voltage of the voltage V1+V2 and the command value V* of the sine-wave target voltage. Thus, as shown in FIG. 6B, the voltage V3 corresponding to the difference voltage of the voltage V1+V2 having the stepwise waveform and the command value V* of the sine-wave target voltage appears at the point (h) that is the serial connecting node of the seventh and eighth switch elements 16, 17. The voltage V3 indicates the average value of the PWM, and the voltage V3 is the voltage at the point (h) that is the serial connecting node of the seventh and eighth switch elements 16, 17 with the point (e) that is the serial connecting node of the fifth and sixth switch elements 14, 15 as the reference.

Therefore, in the third chopper circuit 7, the command value V* of the sine-wave target voltage whose phase is identical to that of the change in the power system frequency shown with a thin solid line of FIG. 6A, which is the sum of the voltage V1+V2 between the points (a) and (e) shown in FIG. 6A and the voltage V3 between the points (e) and (h) shown in FIG. 6B, appear at the point (h) that is the serial connecting node of the seventh and eighth switch elements 16, 17 with the first reference potential at the point (a) that is the ground as the reference.

In the third chopper circuit 7, the chopping is performed at the frequency of three times the system frequency and the difference with the sine-wave current is eliminated, so that at least three-order high-harmonic can be suppressed.

The chopper control of each chopper circuit 5 to 7 by the control circuit 9 of FIG. 1 will now be further described in detail.

The control circuit 9 controls the pulse width of a plurality of square wave voltages rising on the positive side of FIG. 3B by the gate signal with respect to the first and second switch elements 10, 11 of the first chopper circuit 5.

In other words, the fundamental wave component of the output voltage of the first chopper circuit 5 is controlled to match the fundamental wave voltage of the system power supply, where the pulse width δ of the square wave voltage is controlled to take the value calculated with the following equation.

$$\delta = \sin^{-1}[(\sqrt{2}\pi V)/(2Vd1)]$$

Where V is the effective value of the voltage Vs of the system power supply.

The fundamental wave voltage can be increased and decreased by adjusting the pulse width δ by $\Delta\delta_1$, where $\Delta\delta_1$ is calculated by multiplying a coefficient to an error between the measured voltage Vd3 and the target value Vd3* thereof.

The control circuit 9 controls the voltage Vd2 shown in FIG. 4C so as to become ½ of the voltage Vd1 of the first chopper circuit 5 with the gate signal with respect to the third and fourth switch elements 12, 13 of the second chopper circuit 6.

In other words, when the third and fourth switch elements 12, 13 of the second chopper circuit 6 are ON/OFF controlled by the gate signal, the second capacitor 18 repeats charging and discharging as described above to generate the plurality of square wave voltage columns that fall on the negative side shown in FIG. 4C, where the pulse width of the square wave corresponding to the charging period T1, that is, the charging is the same as the pulse width of the square wave output from the first chopper circuit 5, and the pulse width of the square wave corresponding to the discharging period T2, that is, the discharging is adjusted by $\Delta\delta_2$ from the pulse width of the square wave corresponding to the charging.

Here, $\Delta\delta_2$ is calculated by multiplying a coefficient value to the error of the measured voltage Vd2 and the target voltage Vd2*. The target voltage Vd2* is the voltage of ½ of the measured voltage Vd1.

The control circuit 9 controls the pulse width of the square wave voltage as described above according to the fluctuation of the generated power output of the solar cell panel 1.

Figure 7A:
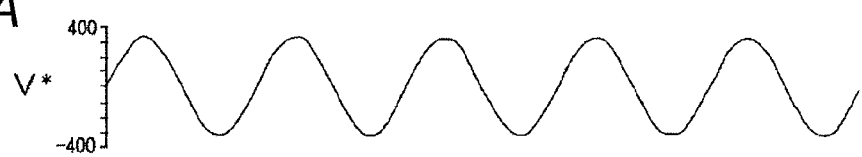
FIG. 7A is a view showing a waveform of the command value V* of the sine-wave target, when an input voltage is 800V.
Figure 7B:
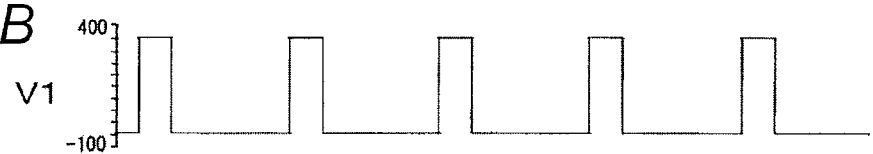
FIG. 7B is a view showing a waveform of the voltage V1 on the positive side by the first chopper circuit, when an input voltage is 800V.
Figure 7C:
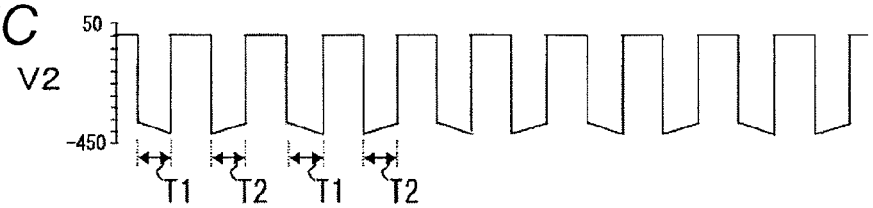
FIG. 7C. is a view showing a waveform of the voltage V2 on the negative side by the second chopper circuit, when an input voltage is 800V.
Figure 8A:
FIG. 8A is a view showing a waveform of the command value V* of the sine-wave target, when the input voltage is 520V.
Figure 8B:
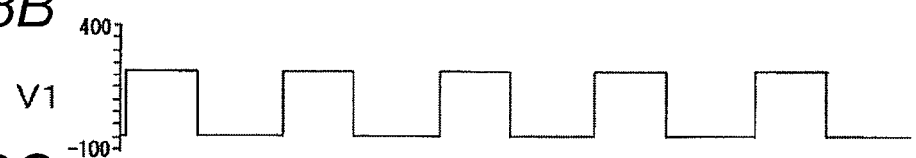
FIG. 8B is a view showing a waveform of the voltage V1 on the positive side by the first chopper circuit, when the input voltage is 520V.
Figure 8C:
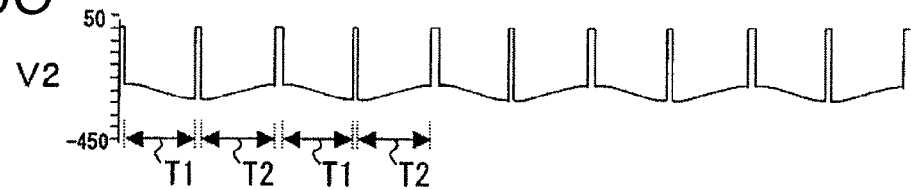
FIG. 8C is a view showing a waveform of the voltage V2 on the negative side by the second chopper circuit, when the input voltage is 520V.

FIGS. 7A to 7C and FIGS. 8A to 8C show the simulation waveforms of the square wave voltages V1, V2 on the positive side and the negative side when the input voltage Vd1 from the solar cell panel 1 fluctuated. FIGS. 7A to 7C show the case where the input voltage Vd1 is 800V, and FIGS. 8A to 8C show the case where the input voltage Vd1 is 520V.

FIG. 7A and FIG. 8A show the command value V* of the sine-wave target voltage. FIG. 7B and FIG. 8B show the voltage V1 on the positive side by the first chopper circuit 5. FIG. 7C and FIG. 8C show the voltage V2 on the negative side by the second chopper circuit 6.

When the input voltage Vd1 lowers, the pulse width of both the square wave on the positive side shown in FIG. 8B and the square wave on the negative side shown in FIG. 8C is controlled to become wide compared to FIGS. 7B and 7C.

The control circuit 9 alternately ON/OFF controls the fifth and sixth switch elements 14, 15 of the third chopper circuit 7 at the timing according to positive and negative of the difference voltage of the voltage V1+V2 having the stepwise waveform shown in FIG. 6A and the command value V* of the sine-wave target voltage, and also PWM controls the seventh and eighth switch elements 16, 17 at high frequency at the duty of correcting the difference voltage to generate a sine wave voltage of the command value V* of the target voltage, as described above.

FIGS. 9A to 9F show a simulation waveform of each unit of FIG. 1, where ground is the reference in all such waveforms.

FIG. 9A is the system voltage Vs, FIG. 9B is the output voltage V of the third chopper circuit 7, FIG. 9C is the system current Is, FIG. 9D is the voltages V1 and V2 (broken line), FIG. 9E is the voltage V3, and FIG. 9F is the voltages Vd2 and Vd3 (broken line).

In the embodiment, as described above, the first and second switch elements 10, 11 of the first chopper circuit 5 switch, for example, the voltage of 800V at the first frequency $f_1$ of 50 Hz, the third and fourth switch elements 12, 13 of the second chopper circuit 6 switch, for example, the voltage of 400V at the second frequency $f_2$ of 100 Hz, and the fifth and sixth switch elements 14, 15 of the third chopper circuit 7 switch, for example, the voltage of 260V at the third frequency $f_3$ of 150 Hz. In other words, the switch elements 10 to 15 switch at a significantly low frequency compared to the PWM frequency of the inverter of PWM control of the conventional power conditioner.

The seventh and eighth switch elements 16, 17 of the third chopper circuit 7 PWM control the voltage of about 260V that is the difference voltage of the voltage V1+V2 having the stepwise wave form and the command value V* of the sine-wave target voltage at a high frequency of 18 kHz. In other words, a low voltage is switched in the seventh and eighth switch elements 16, 17 compared to the inverter of PWM control of the conventional power conditioner.

Therefore, the switching loss can be reduced and the switch element of low conduction loss and the inexpensive switch element can be selected since switching is carried out at significantly low frequency compared to the conventional PWM control in the first to sixth switch elements 10 to 15 of the first to third chopper circuits 5 to 7, and the switching loss can be reduced since switching is carried out at low voltage compared to the conventional PWM control in the seventh and eighth switch elements 16, 17 of the third chopper circuit 7.

Therefore, the power conversion efficiency of the power conditioner 3 can be enhanced compared to the power conditioner of the conventional example.

The square wave voltage generation unit includes the first chopper circuit 5, the second chopper circuit 6, the fifth and sixth switch elements 14, 15 and the third capacitor 19 of the third chopper circuit 7, and the control circuit 9 for controlling the same, and the sine wave voltage generation unit includes the seventh and eighth switch elements 16, 17 of the third chopper circuit 7 and the control circuit 9 for controlling the same.

In the embodiment, the solar cell panel 1 is configured from a thin film solar cell made of amorphous silicon, as described above.

Degradation over time is known occur when the negative electrode side potential becomes lower than the ground potential in such a solar cell made of amorphous silicon, and thus the negative electrode side needs to be at the ground potential as a countermeasure.

Figure 14:
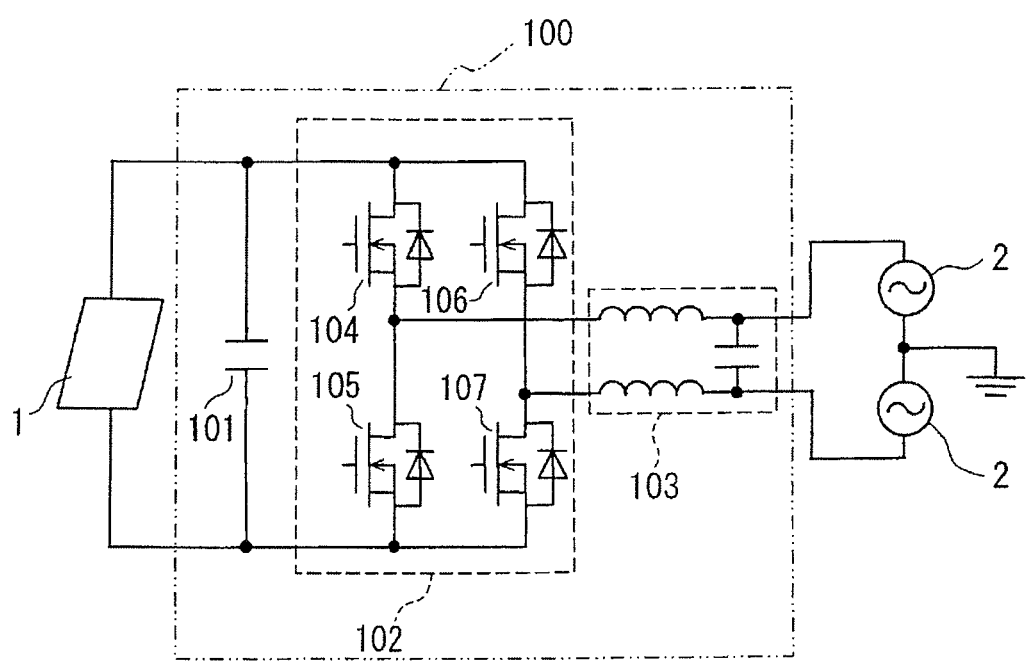
FIG. 14 is a schematic of a conventional photovoltaic system including a non-insulating type power conditioner.

However, since the level of reference potential differs for the DC side and the AC side in the non-insulating type power conditioner 100 shown in FIG. 14, the negative electrode side of the solar cell 1 that is the input side of the power conditioner 100 cannot be made the ground potential. In the power conditioner 3 of the present embodiment, on the other hand, the negative electrode side of the solar cell 1 can be made the ground potential since the level of reference potential is the same on the DC side and the AC side.

In the embodiment described above, description has been made regarding application to the single-phase two-wire, but application can be made to the single-phase three-wire, Δ type three-phase three-wire, or Y-type three-phase four-wire as other embodiments of the present disclosure.

The control circuit 9, which is the characteristic of the present embodiment, will now be described with reference to FIG. 10. As shown in FIG. 10, the control circuit 9 includes a measurement circuit section 9a for measuring the inter-end voltages Vd1, Vd2, Vd3 of the first to third capacitors 4, 18, 19, and a control circuit section 9b for performing a predetermined control operation from the measurement output of the measurement circuit section 9a.

The measurement circuit section 9a includes first to third differential amplifier circuits 9a1, 9a2, 9a3 for differentially amplifying the inter-end voltages of the first to third capacitors 4, 18, 19.

The control circuit section 9b calibrates the in-phase component in the respective output of the first to third differential amplifier circuits 9a1, 9a2, 9a3 as an in-phase error, and outputs the ON/OFF control output to each of the switch elements 10 to 17 by the calibrated measurement output from the first to third differential amplifier circuits 9a1, 9a2, 9a3.

In the power conditioner 3 having such a configuration, if the in-phase component is contained in the input component to the differential amplifier circuits 9a1, 9a2, 9a3 for differentially amplifying the voltages Vd1, Vd2, Vd3 of both ends of the first to third capacitors 4, 18, 19, such in-phase component appears on the output side as the error component.

In the control circuit section 9b, the analog measurement signals from the differential amplifier circuits 9a1, 9a2, 9a3 are A/D converted, and the digital measurement signals, which is the A/D converted values, contain the error component. Thus, the highly accurate operation of the power conditioner 3 is influenced if the ON/OFF control of each switch element is performed with the error component contained.

Figure 11:
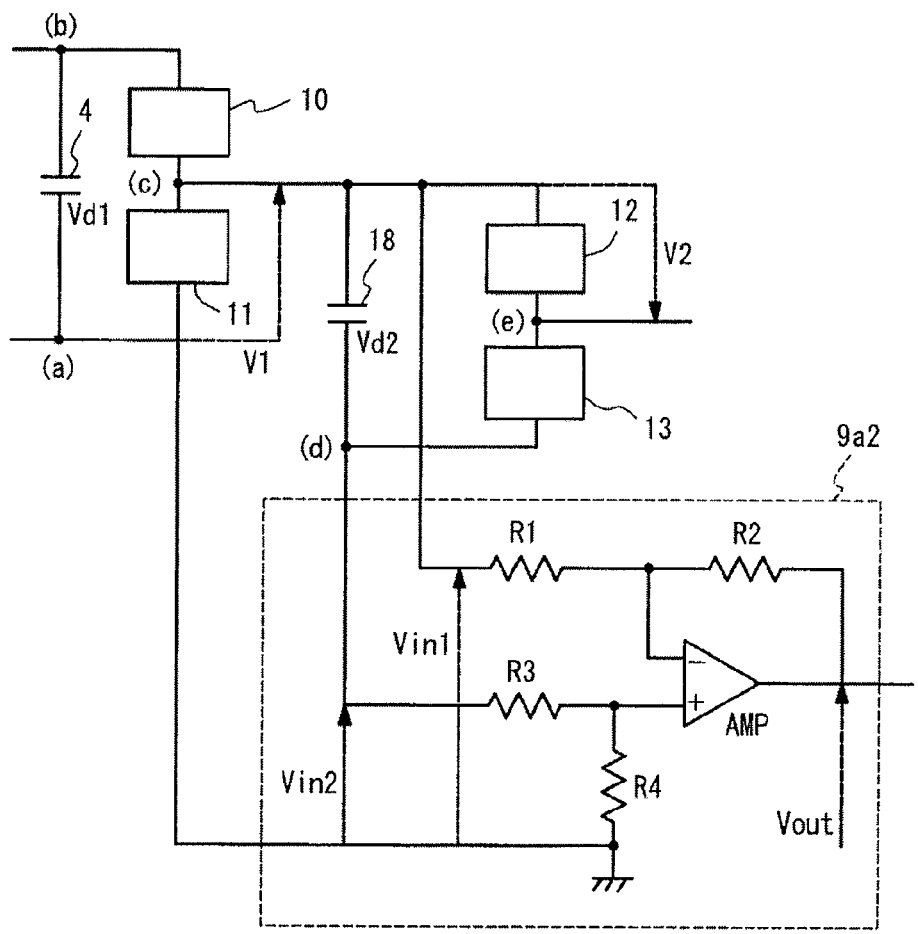
FIG. 11 is a view showing a schematic of a differential amplifier circuit with respect to the control circuit of FIG. 10.

The present embodiment has features in that such an in-phase error component is calibrated. The differential amplifier circuit 9a2 will be representatively described below with reference to FIG. 11. Other differential amplifier circuits 9a3 are similar. The differential amplifier circuit 9a2 includes resistors R1 to R4 and an amplifier part AMP, where one input side of the amplifier part AMP is connected to one capacitor electrode (point (c)) of the second capacitor 18 through the resistor R1, and the other input side is connected to the other capacitor electrode (point (d)) of the second capacitor 18 through the resistor R3. The voltage Vin1 of one input side of the amplifier part AMP is the voltage from the ground (point (a)) at one capacitor electrode (point (c)) of the second capacitor 18, and the voltage Vin2 of the other input side is the voltage from the ground (point (a)) at the other capacitor electrode (point (d)) of the second capacitor 18. The output of the differential amplifier circuit 9a2 can be calculated with equation (1) where R1 to R4 are resistance values of each resistor R1 to R4, and Vout is the output voltage of the differential amplifier circuit 9a2. The voltage V1 is the voltage at the point (c) that is the serial connecting node of the first and second switch elements 10, 11 of the first chopper circuit 5 having the potential at the point (a) that is the ground as the first reference potential. The voltage V2 is the voltage at the point (e) that is the serial connecting node of the third and fourth switch elements 12, 13 of the second chopper circuit 6 having the potential at the point (c) as the second reference potential.

$$Vin1*R2/(R1+R2)+Vout*R1/(R1+R2)=Vin2*R4/(R3+R4) \quad (1)$$

In equation (1), assuming (Vin2−Vin1)=Vd2 is the differential component and Vin2 is the in-phase component, equation (1) can be separated to the differential component and the in-phase component since its purpose is to measure the inter-end voltage Vd2 of the second capacitor 18 thereby obtaining equation (2).

$$Vout=(Vin2-Vin1)*R2/R1+Vin2*(R1*R4-R2*R3)/\{R1*(R3+R4)\}+Vout\text{-offset} \quad (2)$$

Here the first term (Vin2−Vin1)*R2/R1 is the differential component, the second term Vin2*(R1*R4−R2*R3)/{R1*(R3+R4)} is the in-phase component (referred to as in-phase error), and the third term Vout-offset is the offset value unique to the differential amplifier circuit 9a2.

In the differential amplifier circuit 9a2, the output Vout of the differential amplifier circuit 9a2 is affected when the Vin2 of the in-phase error in the second term changes. The in-phase error is proportional to Vin2.

Figure 12:
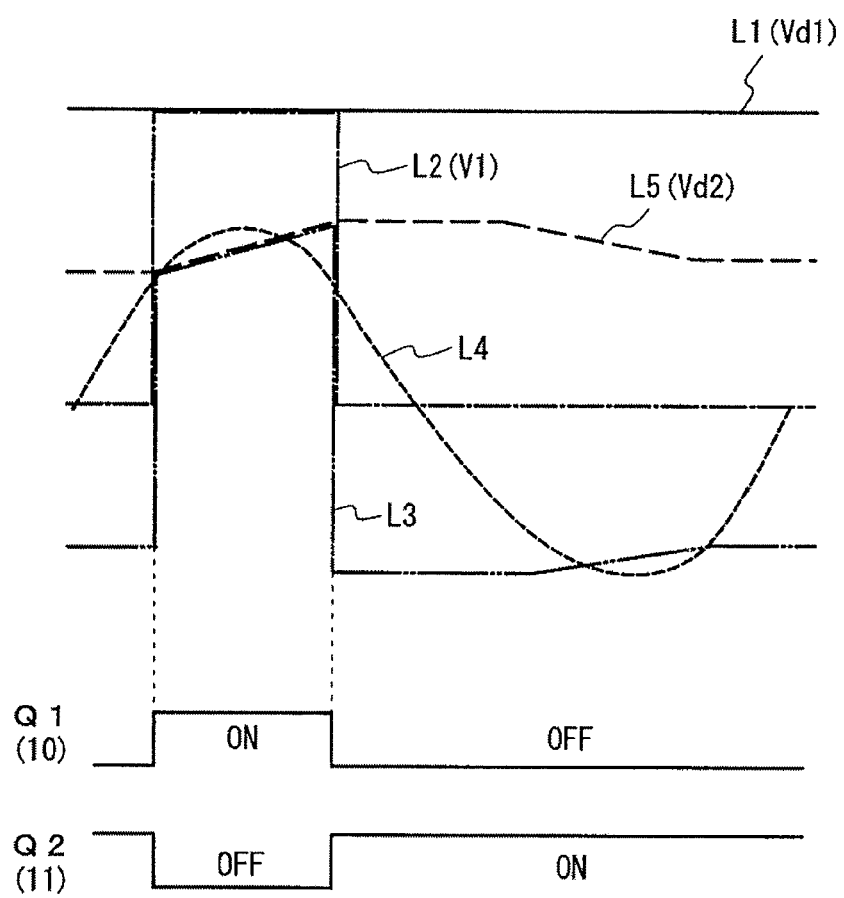
FIG. 12 is a view showing in-phase error with respect to the control circuit of FIG. 10.

Describing the in-phase error with reference to FIG. 12, L1 is a line indicating the inter-end voltage Vd1 of the first capacitor 4 in FIG. 12. The line L1 is constant. L2 is a line indicating the voltage V1. The voltage V1 is the voltage at the point (c) from the ground (point (a)). L3 is a line indicating the voltage (V1−Vd2)=Vin2. L4 is a line of a sine-wave target voltage synchronized to the system frequency of the commercial power supply 2. L5 is a line of the inter-end voltage Vd2 of the second capacitor 18. The voltage Vd2 is the inter-end voltage of the second capacitor 18. The voltage Vd2 rises drawing a charging curve when the switch element 10 is turned ON, and falls from charging stabilization drawing a discharging curve when the switch element 10 is turned OFF. Q1 indicates the ON/OFF period of the switch element 10, and Q2 indicates the ON/OFF period of the switch element 11.

In the above description, the in-phase error proportional to the value of Vin2, that is, the value of (V1−Vd2) appears in the output Vout of the differential amplifier circuit 9a2 in the ON period of the switch element 10 with respect to the line L5 shown in FIG. 12.

Figure 13:
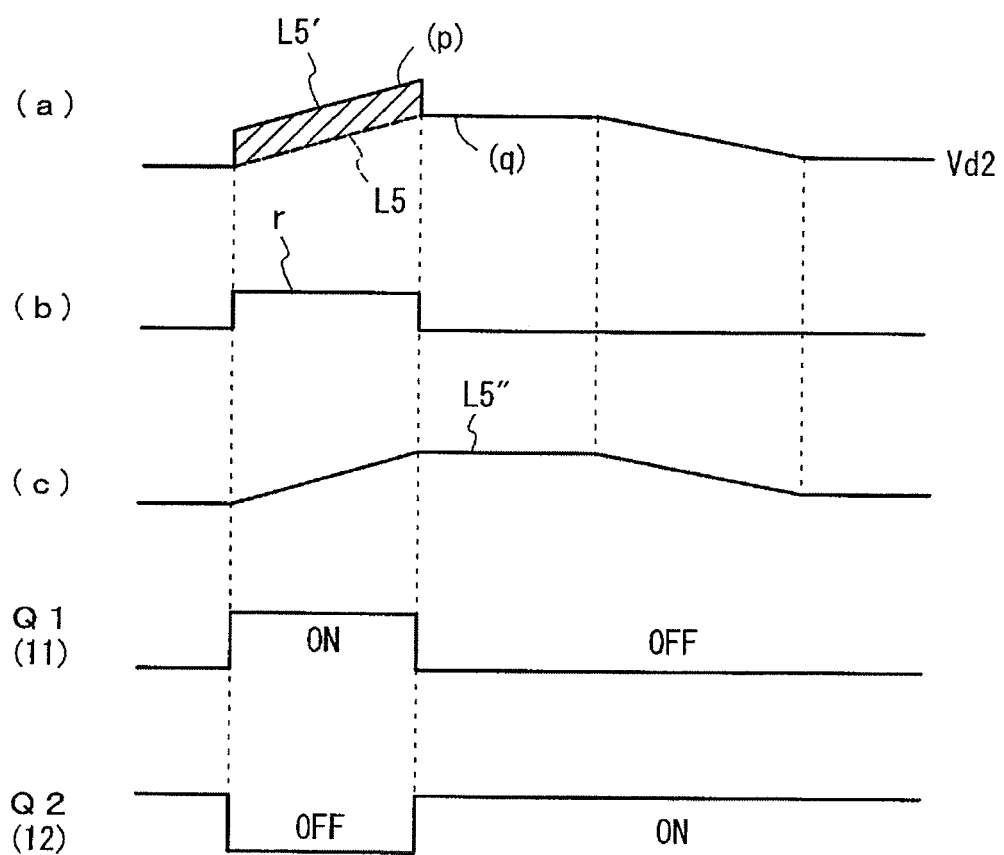
FIG. 13A is a further view showing in-phase error with respect to the differential amplifier circuit 9a2
FIG. 13B is view showing digital processing performed with respect to FIG. 13A.
FIG. 13C is a further view whoring digital processing performed with respect to FIG. 13A.

The in-phase error will be described with reference to FIGS. 13A to 13C. FIG. 13A shows a line L5' indicating the output Vout of the differential amplifier circuit 9a2. The voltage Vd2 of the second capacitor 18 is L5.

When differentially amplifier in the differential amplifier circuit 9a2, the output Vout thereof changes as shown with line L5' in FIG. 13A. This is due to the second term component in equation (2). In the ON period of the switch element 10, the voltage of the measurement output Vout has a difference indicated with hatching with respect to the voltage Vd2 of the second capacitor 18 when the line L5' is compared with respect to the line L5. The output Vout indicated with the line L5' is input to the control circuit section 9b. In the control circuit section 9b, the in-phase error correction amount (r) exists as shown in FIG. 13B, and the in-phase error in the ON period of the switch element 10 of the output Vout input from the differential amplifier circuit 9a2 is calibrated (canceled) by such an in-phase error correction amount (r). As a result, the ON/OFF of the switch elements 10, 11 is controlled according to a line L5" in which the in-phase error is corrected shown in FIG. 13C in the control circuit section 9b. FIGS. 13B and 13C are provided for illustration, and digital processing is carried out in accordance with the content corresponding to FIGS. 13B and 13C according to the output Vout of FIG. 13A input from the differential amplifier circuit 9a2 of the measurement circuit section 9a in the control circuit section 9b. With respect to the in-phase error correction amount (r), the level difference of the level (p) of the line L5' immediately before the end of the ON period of the switch element and the level (q) of the line L5' immediately after the end of the ON period of the switch element in FIG. 13A may be calculated, and the in-phase error correction amount (r) may be set from such a value of calculation.

As described above, according to the present embodiment, the in-phase component in the output of the differential amplifier circuits 9a1 to 9a3 of the measurement circuit section 9a a is corrected as the in-phase error and a predetermined control is carried out in the control circuit section 9b by the calibrated measurement output in the control circuit 9, and hence ON/OFF control of the switch elements 10 to 17 can be carried out at higher accuracy, and the power conditioner 3 can be consequently control operated at higher accuracy.

The in-phase error can be calibrated in the differential amplifier output of the inter-end voltage Vd3 of the third capacitor 19 in the differential amplifier circuit 9a3 based on a similar idea as above, and hence the detailed description thereof will be omitted.

What is claimed is:

1. A control circuit, comprising;
a measurement controller that measures an inter-end voltage of a capacitor; and
a circuit controller that performs a control operation from a measurement output of the measurement controller, wherein:
the measurement controller includes a differential amplifier circuit that differentially amplifies the inter-end voltage of the capacitor,
the circuit controller calibrates an in-phase component in an output of the differential amplifier circuit as an in-phase error, performs the control operation from a calibrated measurement output from the differential amplifier circuit, and performs a calibration by cancelling the in-phase error by an in-phase error correction amount.

2. A power conditioner, comprising:
a chopper circuit formed by connecting at least two switch elements in a series;
a capacitor connected in parallel to the chopper circuit; and
a control circuit that controls an ON/OFF status of the switch elements in the chopper circuit to control charging and discharging of the capacitor, wherein the control circuit comprises:
  a measurement controller that measures an inter-end voltage of a capacitor, wherein the measurement controller includes a differential amplifier circuit that differentially amplifies the inter-end voltage of the capacitor; and
  a circuit controller that performs a control operation from a measurement output of the measurement controller, wherein the circuit controller calibrates an in-phase component in an output of the differential amplifier circuit as an in-phase error and performs the control operation from a calibrated measurement output from the differential amplifier circuit,
wherein one of at least two inputs to the differential amplifier circuit is a voltage from a ground of one of the capacitor electrodes when a DC voltage is charged from the one capacitor electrode to the capacitor through one of the switch elements of the chopper circuit during an ON period of the switch element, and the other is a voltage from the ground of the other capacitor electrode.

3. A power conditioner, comprising:
a chopper circuit formed by connecting at least two switch elements in a series;
a capacitor connected in parallel to the chopper circuit; and
a control circuit that controls an ON/OFF status of the switch elements in the chopper circuit to control charging and discharging of the capacitor,
wherein the control circuit is configured by the control circuit according to claim 1.

4. The power conditioner according to claim 3, wherein one of at least two inputs to the differential amplifier circuit is a voltage from a ground of one of the capacitor electrodes when a DC voltage is charged from the one capacitor electrode to the capacitor through one of the switch elements of the chopper circuit during an ON period of the switch element, and the other is a voltage from the ground of the other capacitor electrode.

5. A photovoltaic system, comprising:
a thin film solar cell; and
a power conditioner, arranged between the thin film solar cell and a commercial power supply, that converts a DC power from the thin film solar cell to an AC power that is interconnected to a system of the commercial power supply and outputting the AC power,
wherein the power conditioner is the power conditioner according to claim 2.

6. A photovoltaic system, comprising:
a thin film solar cell; and
a power conditioner, arranged between the thin film solar cell and a commercial power supply, that converts a DC power from the thin film solar cell to an AC power that is interconnected to a system of the commercial power supply and outputting the AC power,
wherein the power conditioner is the power conditioner according to claim 3.

7. A photovoltaic system, comprising:
a thin film solar cell; and
a power conditioner, arranged between the thin film solar cell and a commercial power supply, that converts a DC power from the thin film solar cell to an AC power that is interconnected to a system of the commercial power supply and outputting the AC power,
wherein the power conditioner is the power conditioner according to claim 4.

* * * * *

UNITED STATES PATENT AND TRADEMARK OFFICE
CERTIFICATE OF CORRECTION

PATENT NO.          : 8,542,504 B2
APPLICATION NO.     : 13/028681
DATED               : September 24, 2013
INVENTOR(S)         : Masao Mabuchi et al.

It is certified that error appears in the above-identified patent and that said Letters Patent is hereby corrected as shown below:

On Title Page, Column 2 (line 1), item (57) Abstract, please insert --to-- after "configured".

Signed and Sealed this
Twenty-seventh Day of May, 2014

Michelle K. Lee
*Deputy Director of the United States Patent and Trademark Office*